United States Patent
Sawano et al.

(10) Patent No.: US 10,601,418 B2
(45) Date of Patent: Mar. 24, 2020

(54) POWER SUPPLY CONTROL DEVICE

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

(72) Inventors: Shunichi Sawano, Mie (JP); Yuuki Sugisawa, Mie (JP)

(73) Assignees: AutoNetworks Technologies, Ltd., Yokkaichi, Mie (JP); Sumitomo Wiring Systmes, Ltd., Yokkaichi, Mie (JP); Sumitomo Electric Industries, Ltd., Osaka-Shi, Osaka (JP)

(*) Notice: Subject to any disclaimer, the term of this patent is extended or adjusted under 35 U.S.C. 154(b) by 0 days.

(21) Appl. No.: 16/310,321

(22) PCT Filed: Jun. 7, 2017

(86) PCT No.: PCT/JP2017/021068
§ 371 (c)(1),
(2) Date: Dec. 14, 2018

(87) PCT Pub. No.: WO2017/217289
PCT Pub. Date: Dec. 21, 2017

(65) Prior Publication Data
US 2019/0214982 A1 Jul. 11, 2019

(30) Foreign Application Priority Data
Jun. 16, 2016 (JP) .................................. 2016-120190

(51) Int. Cl.
*H03K 17/687* (2006.01)
*G05F 3/24* (2006.01)
*H03K 17/00* (2006.01)

(52) U.S. Cl.
CPC ........... *H03K 17/687* (2013.01); *H03K 17/00* (2013.01)

(58) Field of Classification Search
CPC . G05F 3/30; G05F 3/245; G05F 3/262; G11C 5/14
See application file for complete search history.

(56) References Cited

U.S. PATENT DOCUMENTS

2019/0258284 A1* 8/2019 Sawano .................. G05F 3/24

FOREIGN PATENT DOCUMENTS

JP 2004-347423 A 12/2004
JP 2013-016959 A 1/2013
(Continued)

OTHER PUBLICATIONS

International Search Report, Application No. PCT/JP2017/021068, dated Aug. 29, 2017.

*Primary Examiner* — Hai L Nguyen
(74) *Attorney, Agent, or Firm* — Honigman LLP (57) ABSTRACT

If a main switch and a sub-switch are OFF and ON respectively, a comparator compares a source voltage value of the main switch to an output voltage value of a direct-current power source. In the same case, the comparator compares an end-to-end voltage value between a source and a drain of the main switch to a threshold value. A voltage value of the voltage applied to one end of the sub-switch is lower than the voltage value at the drain of the main switch. The output voltage value of the direct-current power source is lower than the voltage value. The threshold value is lower than the difference between the voltage value at the drain of the main switch and the voltage.

13 Claims, 4 Drawing Sheets

(56) References Cited

FOREIGN PATENT DOCUMENTS

| JP | 2014-216765 A | 11/2014 |
| JP | 2014-239380 A | 12/2014 |

\* cited by examiner

| State | Normal | Open circuit | Short Circuit |
|---|---|---|---|
| Source voltage value Vs | Less than Vr1 | Equal to or greater than Vr1 | Equal to or greater than Vr1 |
| End-to-end voltage value Vds | Equal to or greater than Vth2 | Equal to or greater than Vth2 | Less than Vth2 |
| Output | Zero V | First voltage | Second voltage |

Control signal: low-level voltage
Detection instruction signal: high-level voltage

FIG. 4

POWER SUPPLY CONTROL DEVICE

CROSS-REFERENCE TO RELATED APPLICATIONS

This application is the U.S. national stage of PCT/JP2017/021068 filed Jun. 7, 2017, which claims priority of Japanese Patent Application No. JP 2016-120190 filed Jun. 16, 2016.

TECHNICAL FIELD

The present disclosure relates to a power supply control device that controls the supply of power via a switch.

BACKGROUND

Power supply control devices are provided in vehicles to control the supply of power to a load from a direct-current power source to a load (See JP 2014-216765A, for example). In the power supply control device disclosed in JP 2014-216765A, a direct-current power source is connected to a current output end of a first switch, and a load is connected to the current input end of the first switch. The supply of power from the direct-current power source to the load is controlled by the first switch being switched to ON or OFF.

In the power supply control device disclosed in JP 2014-216765A, a series arrangement of a second switch a resistor in a series circuit is connected in parallel to the first switch, and the voltage of the current output end of the first switch is detected.

If the current output end of the first switch is an open circuit, that is, if a conductor between the first switch and the load is disconnected, when the first switch and the second switch are respectively OFF and ON, the detected voltage value is the output voltage value of the direct-current power source, because no current flows through the resistor. A predetermined voltage is set to a voltage that is lower than the output voltage of the direct-current power source. If the detected voltage value is greater than or equal to the predetermined voltage in a state in which the first switch and the second switch are respectively OFF and ON, an open circuit of the power output end of the first switch is detected.

In a case where the current input end and the current output end of the first switch have short-circuited, if the first switch and the second switch are both OFF, the detected voltage value is the output voltage value of the direct-current power source, and is great or equal to the predetermined voltage value. If the detected voltage value is greater than or equal to the predetermined voltage value in a state in which the first switch and the second switch are both OFF, a short circuit between the current input end and the current output end of the first switch is detected.

However, in the power supply control device disclosed in JP 2014-216765A, in one state depending on whether the first switch and second switch are ON or OFF, for example a state in which the first switch and the second switch are both OFF, neither an open circuit of the current output end of the first switch, nor a short circuit between the current input end and the current output end of the first switch, can be detected. For this reason, the power supply control device described in JP 2014-216765A has a problem in that an open circuit of the current output end of the first switch and a short circuit between the current input end and the current output end of the first switch cannot easily be detected.

The present disclosure has been made in view of such circumstances, and an objective thereof is to provide a power supply control device that can easily detect an open circuit of a current output end of a switch and a short circuit between a current input end and a current output end of a switch.

SUMMARY

A power control device for controlling the supply of power via a switch according to an aspect of the present disclosure includes:
a resistor whose one end is connected to a current output end of the switch and to the other end of which a voltage can be applied whose voltage value is lower than an output end voltage value at a current input end of the switch,
a first comparison unit configured to compare an output end voltage value at the current output end with a first threshold value, and
a second comparison unit configured to compare an end-to-end voltage value across the two ends of the switch with a second threshold value.
wherein the first threshold value is lower than an applied voltage value of the voltage applied to the other end of the resistor, and
the second threshold value is lower than a difference between the input end voltage and the applied voltage value.

According to this aspect of the present disclosure, for example, the power supply from the battery to the load is controlled via the switch. In this case, the input end voltage value of the current input end of the switch corresponds to the output voltage value of the battery. An applied voltage value, which is the voltage value of a voltage that is applied to the current output end of the switch via the resistors, is lower than the input end voltage value. The first threshold value is lower than the applied voltage value. A second threshold value is lower than a difference between the input end voltage value and the applied voltage value.

If the current output end of the switch is an open circuit, that is, if the conductor between the switch and the load has disconnected, if the switch is OFF, the output end voltage value of the current output end is the applied voltage value due to electric current not flowing through the resistor, and the end-to-end voltage value between the two ends of the switch is the difference between the input end voltage value and the applied voltage value. For this reason, the output end voltage value is higher than the first threshold value, and the end-to-end voltage value is higher than the second threshold value.

In a case where both ends of the switch have short-circuited, if the switch is OFF, the applied voltage value is lower than the input end voltage value, so the output end voltage value is the input end voltage value and the end-to-end voltage value is approximately zero V. For this reason, the output voltage value is higher than the first threshold value, and the end-to-end voltage value is lower than the second threshold value.

In a case of a fault such as an open circuit or a short circuit, if the switch is OFF, current flows through the resistor and the load in that order, and voltage drop occurs in the resistor. If the resistance value of the resistor is sufficiently larger than the impedance of the load, the output end voltage value is extremely low. Accordingly, the output voltage value is lower than the first threshold value, and the end-to-end voltage value is higher than the second threshold value.

As described above, in a state where the switch is OFF, by comparing the output end voltage value to the first threshold value, and comparing the end-to-end voltage value to the second threshold value, an open circuit at the current output end of the switch and a short circuit between the current input end and the current output end of the switch can easily be detected.

The power supply control device according to an aspect of the present disclosure may further include an output circuit that, as a result of comparisons performed by the first comparison unit and the second comparison unit, outputs a first voltage if the output end voltage value is greater than or equal to the first threshold value and the end-to-end voltage value is greater than or equal to the second threshold value, and outputs a second voltage whose voltage value is different to the voltage value of the first voltage if the output end voltage value is greater than or equal to the first threshold value and the end-to-end voltage value is less than the second threshold value.

According to this aspect of the present disclosure, if there is an open circuit at the current output end of the switch, an output circuit outputs the first voltage and a notification of an open circuit at the current output end of the switch is given. If there is a short circuit across the two ends of the switch, the output circuit outputs the second voltage and a notification of an open circuit at the current output end of the switch is given. The number of voltage output ends needed in order to give a notification of an open circuit and a short circuit may be just one, and the number of voltage input ends order to receive this notification may be just one.

In a power supply control device according to another aspect of the present disclosure, the output circuit may include a second switch, a second resistor whose one end is connected to one end of the second switch, an output unit configured to smooth a voltage across two ends of the second resistor and to output the smoothed voltage, and a switch control unit that, as a result of a comparison performed by the first comparison unit and the second comparison unit, alternately switches the second switch ON and OFF with a first duty ratio if the output end voltage value is greater than or equal to the first threshold value and the end-to-end voltage value is greater than or equal to the second threshold value, and alternately switches the second switch ON and OFF with a second duty ratio that is different to the first duty ratio if the output end voltage value is greater than or equal to the first threshold value and the end-to-end voltage value is less than the second threshold value. Wherein a fixed voltage is applied to another end of the second switch and the second resistor respectively.

According to this aspect of the present disclosure, one end of the first switch is connected to one end of the second resistor, and a fixed voltage is applied between the other ends of the second switch and the second resistor respectively. The switching of the switch is alternatively switched between ON and OFF. The end-to-end voltage of the second resistor is smoothed.

The larger the duty ratio for switching the second switch on and OFF, the longer the period in which a fixed voltage is applied across two ends of the second resistor, and the higher the voltage value of the smoothed voltage. The first voltage is output if the duty ratio for switching the second switch ON and OFF is the first duty ratio, and the second voltage is output if the duty ratio according for switching the second switch ON and OFF is the second duty ratio.

A power supply control device according to another aspect of the present disclosure may further include an open circuit signal output unit configured to output and open circuit signal indicating an open circuit at the current output end, if you output circuit outputs the first voltage when the switch is in its OFF state.

According to this aspect of the present disclosure, if there is an open circuit at the current output end of the switch when the switch is OFF, the output circuit outputs the first voltage, and the open circuit signal is output.

The power supply control device according to another aspect of the present disclosure may further include a short circuit signal output unit configured to output a short circuit signal indicating a short circuit between the current input end and the current output end, if the output circuit outputs the second voltage when the switch is in its OFF state.

According to this aspect of the present disclosure, if the current input end and the current output end of the switch have short-circuited, when the switch is OFF, the output circuit outputs the second voltage and the short circuit signal is output.

The power supply control device according to another aspect of the present disclosure may further include a third switch that is connected in parallel to the resistors.

According to this aspect of the present disclosure, for example, if an open circuit at the current output end of the switch and a short circuit between the current input end and the current output end of the switch are detected, the third switch is switched to ON, and the third switch is switched to OFF if neither an open circuit nor a short circuit is detected. If the third switch is OFF, current does not flow through the resistor, making it possible to suppress unnecessary power consumption.

Advantageous Effects of Disclosure

According to the present disclosure, it is easy to detect an open circuit at the current output end of the switch and a short circuit between the current input end and the current output end of the switch.

DETAILED DESCRIPTION OF PREFERRED EMBODIMENTS

The following describes the present disclosure based on the diagrams of the embodiments.

First Embodiment

Figure 1:
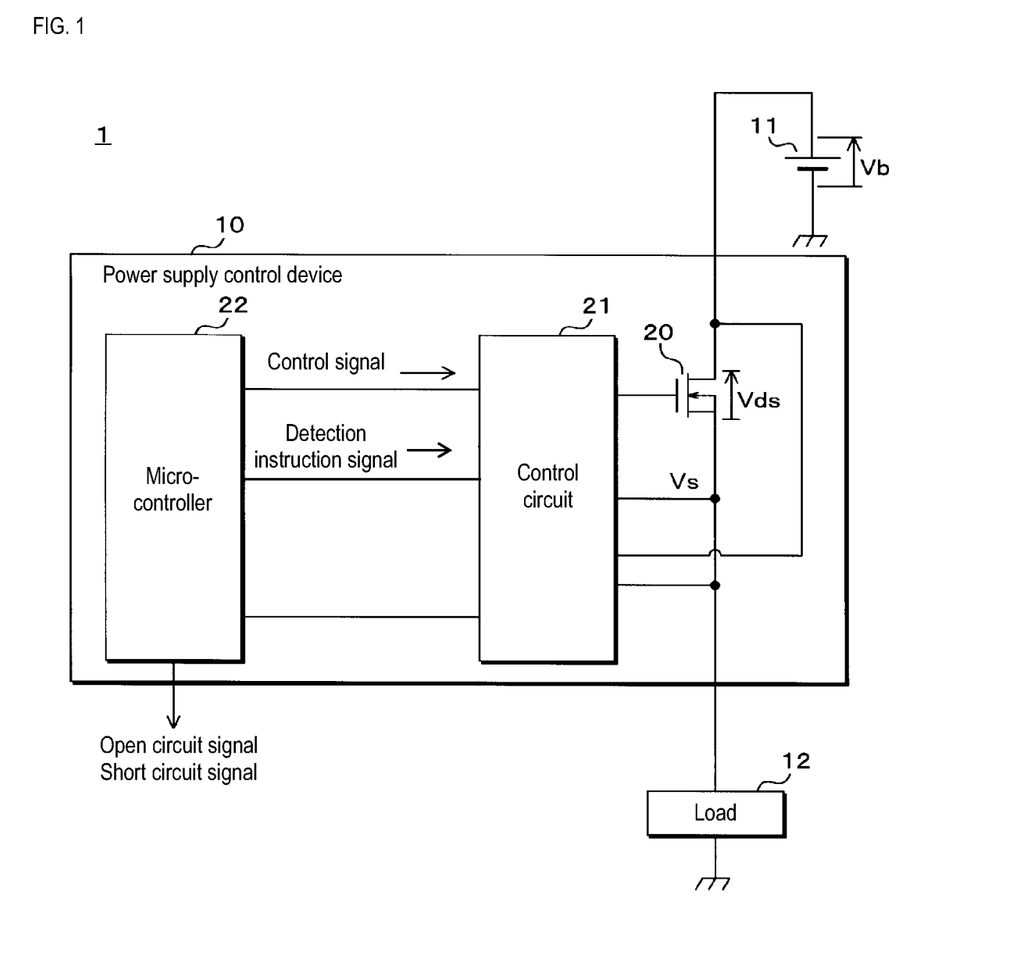
FIG. 1 is a block diagram showing the main configuration of a power supply system in a first embodiment.

FIG. 1 is a block diagram showing the main configuration of a power supply system in the first embodiment. A power supply system 1 is suitably provided in a vehicle, and includes a power supply control device 10, a battery 11 and a load 12. The power supply control device 10 is connected to a cathode of the battery 11, and to one end of the load 12. The anode of the battery 11 and the other end of the load 12 are grounded.

In the power supply system 1, the battery 11 supplies power via the power supply control device 10 to the load 12. The power supply control device 10 controls the supply of power from the battery 11 to the load 12. The load 12 is an electrical instrument that is provided in a vehicle. If power is supplied from the battery 11 to the load 12, the load 12 operates, and if the supply of power from the battery 11 to the load 12 is stopped, the operation of the load 12 stops.

The power supply control device 10 has a main switch 20, a control circuit 21 and a microcontroller 22. The main switch 20 is an N-channel FET (Field Effect Transistor). The drain of the main switch 20 a drain is connected to the cathode of the battery 11 and the control circuit 21, its a source is connected to one end of the load 12 and the control circuit 21, and its gate is connected to the control circuit 21. The control circuit 21 is also connected to the microcontroller 22.

If the voltage value at the gate of the main switch 20, relative to the ground potential, is greater than or equal to a certain voltage value, it is possible for current to flow between the drain and the source. At this time, the main switch 20 is ON. Also, regarding the main switch 20, if the voltage value at the gate, relative to the ground potential, is less than the certain voltage value, current does not flow between the drain and the source. At this time, the main switch 20 is OFF. The control circuit 21 switches the main switch 20 to ON or OFF by adjusting the voltage value at the gate of the main switch 20, relative to the ground potential.

A control signal for the purpose of controlling the operation of the load 12 is output from the microcontroller 22 to the control circuit 21. The control signal is constituted by a high-level voltage and a low-level voltage. Here, high-level voltage indicates operation of the load 12, and low-level voltage indicates the operation of the load 12 is stopped.

The control circuit 21 switches the main switch 20 to ON if the control signal indicates high-level voltage. Through this, power is supplied from the battery 11 via the main switch 20 to the load 12, and the load 12 operates. If power is supplied from the battery 11 via the main switch 20 to the load 12, the current flows from the cathode of the battery 11 through the drain and source of the main switch 20 in that order. The drain and source of the main switch 20 respectively function as the current input end and the current output end.

If the control signal is at low-level voltage, the control circuit 21 switches the main switch 20 to OFF. Through this, the supply of power from the battery 11 to the load 12 is stopped, and the operation of the load 12 is stopped.

The control circuit 21 receives the voltage value Vs (hereafter referred to as the source voltage value) at the source of the main switch 20, relative to the ground potential, and an end-to-end voltage value Vds, which is the difference between the respective voltage values at the drain and the source of the main switch 20, relative to the ground potential. The end-to-end voltage value Vds is the voltage value at the drain, relative to the voltage of the source of the main switch 20. The source voltage value Vs is equivalent to the output end voltage value. The voltage value at the drain of the main switch 20, that is, the output voltage value Vb of the battery 11, is equivalent to the input end voltage value.

A detection instruction signal instructs detection for an open circuit at the source of the main switch 20, or, a short circuit between the drain and the source of the main switch 20, and is input from the microcontroller 22 to the control circuit 21. The detection instruction signal is constituted by a high-level voltage and a low-level voltage. Here, a high-level voltage indicates that the detection for an open circuit or a short circuit is instructed, and a low-level voltage indicates that detection for an open circuit or a short circuit is not necessary. An open circuit of the source of the main switch 20 is, specifically, the disconnection of the conductor that connects the source of the main switch 20 to one end of the load 12. This disconnection occurs on the outside of the power supply control device 10. A short circuit between the drain and source of the main switch 20 is commonly referred to as a "line fault".

If the control signal and the detection instruction signal show a low-level signal and a high-level signal respectively, the control circuit 21 switches the main switch 20 to OFF, and an open circuit at the source and a short circuit between the drain and the source of the main switch 20 is detected based on the source voltage value Vs and the end-to-end voltage value Vds. If neither an open circuit at the source of the main switch 20, nor a short circuit between the drain and the source of the main switch 20 have have occurred, that is, if the state of the power supply system 1 is normal, then control circuit 21 outputs zero V to the microcontroller 22. If there is an open circuit at the source, then control circuit 21 outputs a first voltage to the microcontroller 22. The control circuit 21, if there is a short circuit between the drain and the source of the main switch 20, outputs a second voltage to the microcontroller 22. The voltage value of the second voltage is higher than the voltage value of the first voltage.

By switching the voltage of the control signal that is output to the control circuit 21 to a high-level voltage or a low-level voltage, the microcontroller 22 controls the supply of power from the battery 11 via the main switch 20 to the load 12, and controls the operation of the load 12. If the voltage value of the control signal is switched to a low-level voltage, the microcontroller 22 switches the voltage value of the detection instruction signal to a high-level voltage, and monitors the voltage that is output from the control circuit 21 to the microcontroller 22.

Here, if the voltage output from the control circuit 21 is the first voltage, the microcontroller 22 outputs an open circuit signal indicating that there is an open circuit at the source of the main switch 20. Furthermore, if the voltage that is output from the control circuit 21 is the second voltage, the microcontroller 22 outputs a short circuit signal indicating that there is a short circuit between the drain and the source of the main switch 20. The voltage values of the first voltage and second voltage are stored in the microcontroller 22. The open circuit signal and the short circuit signal output by the microcontroller 22 are input to an external apparatus (not shown). If an open circuit signal or a short circuit signal is input, the external apparatus lights up a lamp (not shown), displays a message, or the like, to communicate an open circuit at the source or a short circuit between the drain and the source of the main switch 20. The microcontroller 22 functions as the open circuit signal output unit and the short circuit signal output unit.

Figure 2:
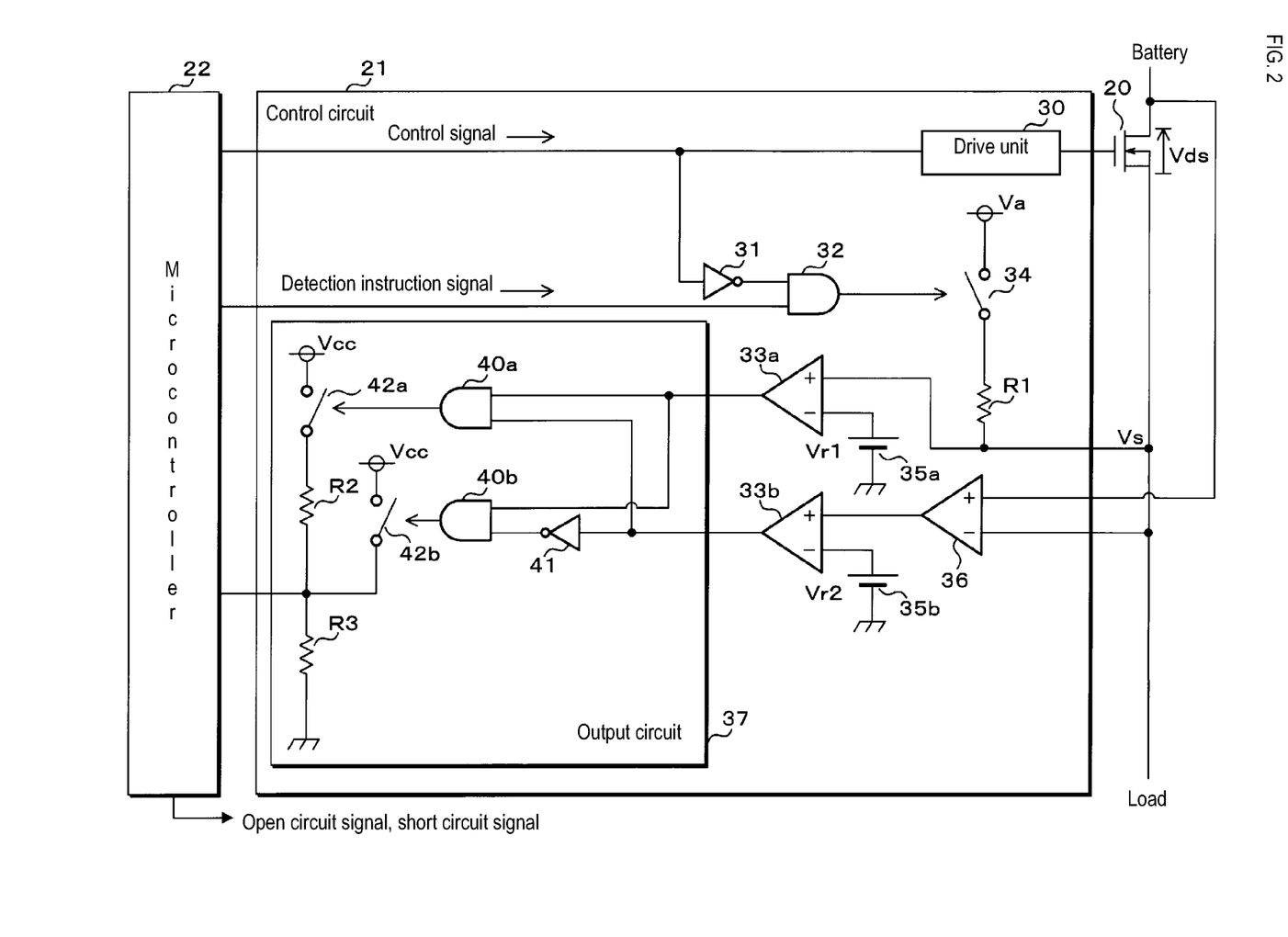
FIG. 2 is a circuit diagram of the control circuit.

FIG. 2 is a circuit diagram of the control circuit 21. The control circuit 21 includes a drive unit 30, an inverter 31, an AND circuit 32, comparators 33a and 33b, a sub-switch 34, direct-current power sources 35a and 35b, a differential amplifier 36, an output circuit 37 and a resistor R1. The output circuit 37 includes AND circuits 40a and 40b, an inverter 41, switches 42a and 42b, and resistors R2 and R3. The drive unit 30 and the inverters 31 and 41 respectively have one input end and one output end. The AND circuits 32, 40a, and 40b respectively have two input ends and one output end. The comparators 33a and 33b and the differential amplifier 36 each respectively have a plus terminal, a minus terminal and an output terminal.

The input end of the drive unit 30 is connected to the microcontroller 22 and the input end of the inverter 31, and the control signal is input into the input end of the drive unit 30 and the inverter 31 respectively. The output end of the drive unit 30 is connected to the gate of the main switch 20. The output end of the inverter 31 is connected to one of the input ends of the AND circuit 32. The other input end of the AND circuit 32 is connected to the microcontroller 22, and the detection instruction signal is input from the microcontroller 22 to the other input end of the AND circuit 32.

The source of the main switch 20 and one end of the resistor R1 are connected to the plus terminal of the comparator 33a. The other end of the resistor R1 is connected to one end of the sub-switch 34. A voltage is applied to the other end of the sub-switch 34. Accordingly, the sub-switch 34 is connected in aeries to the resistor R1, one end of the resistor R1 is connected to the source of the main switch 20, and a voltage is applied to the other end of the resistor R1 via the sub-switch 34. The voltage value Va of this voltage is a positive fixed value, and is lower than the voltage value at the drain of the main switch 20, that is, the output voltage value Vb of the battery 11. The minus terminal of the comparator 33a is connected to the cathode of the direct-current power source 35a. The anode of the direct-current power source 35a is grounded. The output voltage value Vr1 of the direct-current power source 35a is a positive fixed value. The sub-switch 34 functions as a third switch, and the voltage value Va is equivalent to the applied voltage value.

The plus terminal and the minus terminal of the differential amplifier 36 are respectively connected to the drain and the source of the main switch 20. The output terminal of the differential amplifier 36 is connected to the plus terminal of the comparator 33b. The minus terminal of the comparator 33b is connected to the cathode of the direct-current power source 35b. The anode of the direct-current power source 35b is grounded. The output voltage value Vr2 of the direct-current power source 35b is a positive fixed value.

The output terminal of the comparator 33a is connected to one of the input ends of the AND circuits 40a and 40b respectively, of the output circuit 37. The output terminal of the comparator 33b is connected to the other input end of the AND circuit 40a and the input end of the inverter 41. The output end of the inverter 41 is connected to the other input end of the AND circuit 40b. The output circuit 37 has the switches 42a and 42b to which the same voltage is applied respectively to one of their ends. The voltage value Vcc of this voltage is a positive fixed value. The other end of the switch 42a is connected to one end of the resistor R2. The other ends of the switch 42b and the resistor R2 are respectively connected to one end of the microcontroller 22 and the resistor R3. The other end of the resistor R3 is grounded.

By adjusting the voltage of the gate of the main switch 20, the drive unit 30 switches the main switch 20 to ON or OFF. If the control signal input from the microcontroller 22 is at high-level voltage the drive unit 30 switches the main switch 20 to ON. Thus, power is supplied to the load 12 from the battery 11. Also, if the control signal input from the microcontroller 22 is at low-level voltage, the drive unit 30 switches the main switch 20 to OFF. Thus, the supply of power from the battery 11 is stopped to the load 12.

By switching the control signal output to the drive unit 30 is switched to low-level voltage or to high-level voltage, The microcontroller 22 controls the supply of power from the battery 11 to the load 12.

The inverter 31 outputs low-level voltage to one input end of the AND circuit 32 from its output end if the control signal is at high-level voltage. Also, the inverter 31 outputs high-level voltage to one input end of the AND circuit 32 from its output end if the control signals is at low-level voltage.

The AND circuit 32 outputs high-level voltage from its output end if the inverter 31 outputs high-level voltage and the detection instruction signal input to the microcontroller 22 is at high-level voltage. Also, the AND circuit 32 outputs low-level voltage from its output end if the inverter 31 is outputting a low-level voltage, or the detection instruction signal input by the microcontroller 22 is at a low-level voltage.

The inverter 31 outputting high-level voltage is equivalent to the control signal being at low-level voltage. The inverter 31 outputting low-level voltage is equivalent to the control signal being at high-level voltage.

If the AND circuit 32 is outputting high-level voltage from its output end, the sub-switch 34 is ON and and current flows through the sub-switch 34 and the resistor R1. If the AND circuit 32 circuit is outputting low-level voltage from its output end, the sub-switch 34 is OFF and current does not flow through the resistor R1.

The comparator 33a compares the source voltage value Vs of the main switch 20 to the output voltage value Vr1 of the direct-current power source 35a. The comparator 33a functions as a first comparison unit and the output voltage value Vr1 is equivalent to a first threshold value.

The comparator 33a outputs high-level voltage from its output end to one input end of the AND circuits 40a and 40b respectively, if the source voltage value Vs of the main switch 20 is greater than or equal to the output voltage value Vr1 of the direct-current power source 35a. The comparator 33a outputs low-level voltage from its output to the input ends of the AND circuits 40a and 40b respectively, if the source voltage value Vs is less than the output voltage value Vr1 of the direct-current power source 35a.

The differential amplifier 36 outputs a voltage value, which is a voltage expressed by the product of the end-to-end voltage value Vds of the main switch 20 and a positive fixed number A, from its output terminal to the plus terminal of the comparator 33b.

The comparator 33b compares the voltage value (A·Vds) of the voltage that is output by the differential amplifier 36 to the output voltage value Vr2 of the direct-current power source 35b. In other words, the comparator 33b compares the end-to-end voltage value Vds between the drain and the source of the main switch 20 to a positive threshold value Vth2 (=Vr2/A). The comparator 33b functions as a second comparison unit and is equivalent to a second threshold value. The symbol "·" expresses a multiplication.

If the voltage value (A·Vds) is greater than or equal to the output voltage value Vr2 of the direct-current power source 35b, that is, if the end-to-end voltage value Vds is greater than or equal to the threshold value Vth2, then the comparator 33b outputs high-level voltage from its output end to the other input end of the AND circuit 40a and the input end of the inverter 41.

If the voltage value (A·Vds) is less than the output voltage value Vr2 of the direct-current power source 35b, that is, if the end-to-end voltage value Vds is less than the threshold value Vth2, the comparator 33b outputs low-level voltage from its output end to the other input end of the AND circuit 40a and the input end of the inverter 41.

The AND circuit 40a of the output circuit 37 outputs high-level voltage from its output end if the comparators 33a and 33b each output an output high-level voltage. The AND circuit 40a outputs low-level voltage from its output end, if at least one of the comparators 33a and 33b have output low-level voltage.

The switch 42a is ON if the AND circuit 40a is outputting high-level voltage, and is OFF if the AND circuit 40a is outputting low-level voltage. If the switch 42a is ON, the voltage applied to one end of the switch is divided by the resistors R2 and R3.

If the comparator 33a and the inverter 41 are outputting high-level voltage, then the AND circuit 40b of the output circuit 37 outputs high-level voltage from its output end. Also, if at least one of the comparator 33a and the inverter 41 are outputting low-level voltage, the AND circuit 40b outputs low-level voltage from its output end.

The inverter 41 outputting high-level voltage is equivalent to the comparator 33b outputting low-level voltage. The inverter 41 outputting low-level voltage is equivalent to the comparator 33b outputting high-level voltage.

The switch 42b is ON if the AND circuit is outputting high-level voltage from its output end, and is OFF if the AND circuit 40b is outputting low-level voltage from its output end.

The AND circuits 40a and 40b never output high-level voltage together, due to the use of the inverter 41. Accordingly, the switches 42a and 42b are never ON together.

If the switches 42a and 42b are both OFF, zero V is output from the control circuit 21 to the microcontroller 22 as current does not flow through the resistor R3.

If the switch 42a is ON and the switch 42b is OFF, the voltage divided by the resistors R2 and R3 is output from the output circuit 37 to the microcontroller 22 as the first voltage. The voltage value of the first voltage is Vcc r3/(r2+r3). Here, r2 and r3 are respectively the resistance values of the resistors R2 and R3. For example, if the resistance values r2 and r3 match, the voltage value of the first voltage is Vcc/2.

If the switch 42a is OFF and the switch 42b is ON, the voltage applied to one end of the switch 42b is output from the output circuit 37 to the microcontroller 22 as the second voltage. The voltage value of the second voltage is Vcc.

Figure 3:
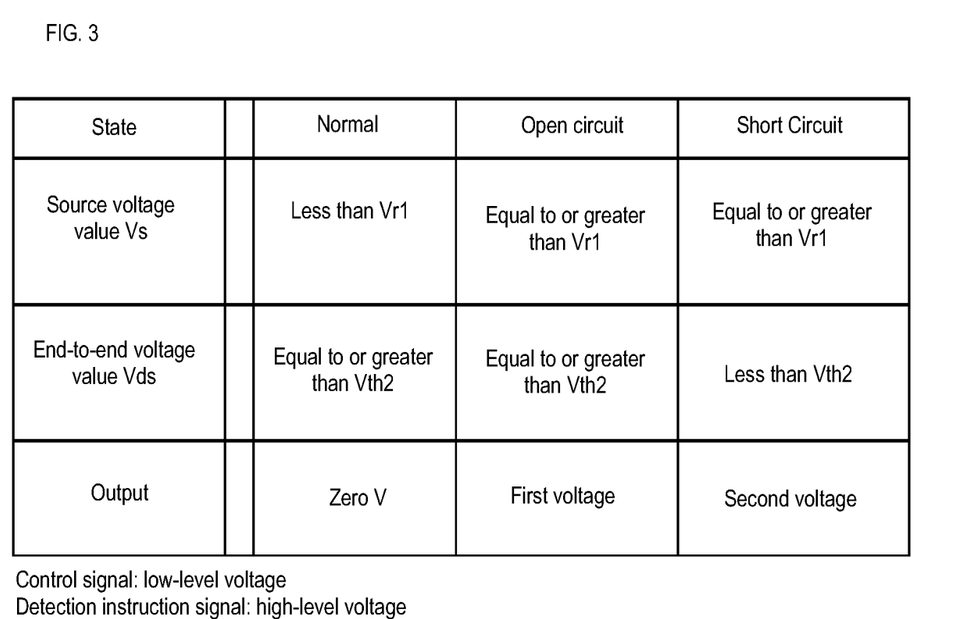
FIG. 3 is a diagram for the purpose of illustrating the operation of the control circuit.

FIG. 3 is a diagram for the purpose of illustrating the operation of the control circuit 21. If the control signal and the detection instruction signal respectively are at low-level voltage and high-level voltage, the AND circuit 32 outputs high-level voltage and the sub-switch 34 switches to ON. As previously mentioned, if the control signal is at low-level voltage, the drive unit 30 switches the main switch 20 to OFF.

If the control signal and the detection instruction signal output from the microcontroller 22 respectively are at low-level voltage and high-level voltage, the control circuit 21 detects an open circuit at the source of the main switch 20 and a short circuit between the drain and the source of the main switch 20.

If the control signal is at high-level voltage or the detection instruction signal shows low-level voltage, the AND circuit 32 outputs low-level voltage, so that the sub-switch 34 does not switch ON, and an open circuit or a short circuit is not detected by the control circuit 21.

The output voltage value Vr1 of the direct-current power source 35a, is lower than the voltage applied to the other end of the sub-switch 34, that is, the voltage value Va of the voltage applied to the other end of the resistor R1, if the the sub-switch 34 is ON. As previously mentioned, the voltage value Va is lower than the output voltage value Vb of the battery 11. If the sub-switch 34 is switched to ON and current flows through the sub-switch 34, the resistor R1 and the load 12 in that order, the voltage applied to the other end of the sub-switch 34 is divided by the resistor R1 and the load 12. The output voltage value Vr1 of the direct-current power source 35a is higher than the voltage value Vd of the voltage divided by the load 12 and the resistor R1.

The threshold value Vth2 (=vr2/A) is lower than the difference between the output voltage value Vb of the battery 11 and the voltage value Va of the voltage applied to the other end of the sub-switch 34, that is, lower than the voltage value (Vb–Va).

If an open circuit at the source of the main switch 20 and a short circuit between the drain and the source of the main switch 20 have not occurred, that is, if the status of the power supply system 1 is normal, when the main switch 20 and the sub-switch 34 are OFF and ON, the source voltage value Vs is the voltage value Vd of the voltage divided by the load 12 and the resistor R1. For this reason, the source voltage value Vs is less than the output voltage value Vr1 of the direct-current power source 35a.

Naturally, the voltage value Vd is lower than the voltage value Va. For this reason, the voltage value (Vb-Va) is lower than the voltage value (Vb-Vd). As previously mentioned, the threshold value Vth2 is lower than the voltage value (Vb–Va). Accordingly, the threshold value Vth 2 is lower than the voltage value (Vb–Vd).

Therefore, if the status of the power supply system 1 is normal, when the main switch 20 and the sub-switch 34 are respectively OFF and ON, the source voltage value Vs is less than the output voltage value Vr1 of the direct-current power source 35b, and the end-to-end voltage value Vds is greater than or equal to the threshold value Vth2. At this time, the comparators 33a and 33b respectively output low-level voltage and high-level voltage, and the comparators 33a and 33b, as a comparison result, show that the source voltage value Vs is less than the output voltage value Vr1 of the direct-current power source 35b, and that the end-to-end voltage value Vds is less than the threshold value Vth2. If the comparators 33a and 33b respectively output low-level voltage and high-level voltage, the AND circuits 40a and 40b both output low-level voltage. Through this, the switches 42a and 42b both switch to OFF. As a result, zero V is output from the output circuit 37 to the microcontroller 22.

If there is an open circuit at the source of the main switch 20, when the main switch 20 and the sub-switch 34 are OFF and ON respectively, current cannot flow through the resistor R1 so the source voltage value Vs is the voltage value Va. As previously mentioned, the output voltage value Vr1 of the direct-current power source 35a is lower than the voltage value Va, and the threshold value Vth2 is lower than the voltage value (Vb–Va).

Accordingly, if there is an open circuit at the source of the main switch 20, when the main switch 20 and the sub-switch 34 are OFF and ON respectively, the source voltage value Vs is greater than or equal to the output voltage value Vr1 of the direct-current power source 35a, and the end-to-end voltage value Vds is greater than or equal to the threshold value Vth2. At this time, the comparators 33a and 33b both output high-level voltage, and as a comparison result, the source voltage value Vs is greater than or equal to the output voltage value Vr1 of the direct-current power source 35a, and the end-to-end voltage value Vds is greater than or equal to the threshold value Vth2.

If the comparators 33a and 33b are both outputting high-level voltage, the AND circuits 40a and 40b output high-level voltage and low-level voltage respectively. Through this, the switches 42a and 42b switch to ON and OFF respectively, and the resistors R2 and R3 divide the voltage applied to one end of the switch 42a. As a result, the first voltage that is generated by the division by the resistors R1 and R2 is output from the output circuit 37 to the microcontroller 22.

Thus, if the output circuit outputs the first voltage in a state in which the main switch 20 and the sub-switch 34 are OFF and ON respectively, the microcontroller 22 outputs an open circuit signal.

If the drain and the source of the main switch 20 short circuit, when the main switch 20 and the sub-switch 34 are OFF and ON respectively, the source voltage value Vs matches the output voltage value Vb of the battery 11. As previously mentioned, the output voltage value Vr1 of the direct-current power source 35a is lower than the output voltage value Vb of the battery 11. Furthermore, the end-to-end voltage value Vds of the main switch 20 is zero V.

Accordingly, if there is a short circuit between the drain and the source of the main switch 20, when the main switch 20 and the sub-switch 34 are OFF and ON respectively, the source voltage value Vs is greater or equal to the output voltage value Vr1 of the direct-current power source 35a, and the end-to-end voltage value Vds is less than the threshold value Vth2. At this time, the comparators 33a and 33b output high-level voltage and low-level voltage respectively, and the comparators 33a and 33b, as a comparative result, show that the source voltage value Vs is greater than or equal to the output voltage value Vr1 of the direct-current power source 35b, and the end-to-end voltage value Vds is less than the threshold value Vth2.

If the comparators 33a and 33b output high-level voltage and low-level voltage respectively, the AND circuits 40a and 40b output low-level voltage and high-level voltage respectively. Through this, the switches 42a and 42b switch to OFF and ON respectively. As a result, the second voltage is output from the output circuit 37 to the microcontroller 22.

Thus, if the output circuit outputs the second voltage in a state in which the main switch 20 and the sub-switch 34 are OFF and ON respectively. a short circuit signal is output to the microcontroller 22.

Note that, as previously described, if the main switch 20 and the sub-switch 34 are OFF and ON respectively, current flows through the sub-switch 34, the resistor R1 and the load 12 respectively in that order, and the resistor R1 and the load 12 divide the voltage applied to the other end of the sub-switch 34. With the control circuit 21, the resistance value r1 of the resistor R1 is sufficiently larger than the impedance value of the load 12. For this reason, if the main switch 20 and the sub-switch 34 are OFF and ON respectively, the source voltage value Vs is extremely low.

Also, the load 12 operates if the source voltage value Vs is greater than or equal to the positive operational voltage value, and its operation is stopped if the source voltage value Vs is less than the operational voltage value.

The operational voltage value is lower than the output voltage value Vb of the battery 11. For this reason, if the main switch 20 is ON, the source voltage value Vs becomes greater than or equal to the operational voltage value, and the load 12 operates.

Also, the operational voltage value is higher than the voltage value of the voltage divided by the resistor R1 and the load 12 if the sub-switch 34 is ON. Accordingly, the load 12 never operates if the main switch 20 and the sub-switch 34 are OFF and ON respectively.

Furthermore, the operational voltage value exceeds zero V. Accordingly, if the main switch 20 and the sub-switch 34 are both OFF, the source voltage value Vs is zero V, and is less than the operational voltage value. Accordingly, the load 12 never operates if the main switch 20 and the sub-switch 34 are both OFF.

In the power supply control device 10 as described above, in a state in which the main switch 20 and the sub-switch 34 are OFF and ON, an open circuit at the main switch 20 and a short circuit between the drain and the source of the main switch 20 can be easily detected by the comparators 33a and 33b performing a comparison.

Also, the output circuit 37 gives a notification of an open circuit at the source of the main switch 20 to the microcontroller 22 by outputting the first voltage to the microcontroller 22, and gives a notification of a short circuit between the drain and the source of the main switch 20 to the microcontroller 22 by outputting the second voltage to the microcontroller 22. For this reason, the number of output ends for voltage needed in order to give a notification of a closed circuit and a short circuit may be just one, and furthermore, the number of input ends for voltage provided in the microcontroller 22 in order to receive this notification may be just one.

Furthermore, if the sub-switch 34 is OFF, current does not flow through the resistor R1, and power is never consumed by the resistor R1. For this reason, while an open circuit and a short circuit are not detected, and it is possible to curb unnecessary power consumption by keeping the sub-switch 34 OFF.

Note that the respective voltage values of first voltage and the second voltage should be different from each other. For this reason, the voltage value of the second voltage may be lower than the value of the first voltage. For example, the positions of the switches 42a and 42b may also be opposite. In this case, the voltage value of the first voltage is expressed by Vcc, the voltage value of the second voltage is expressed by Vcc·r3/(r2+r3) and is lower than the voltage value of the first voltage. As previously described, the resistance values r2 and r3 are the resistance values of the resistors R2 and R3 respectively.

As long as the voltage values of the first voltage and the second voltage are different from each other, the voltage values of the voltage applied to one end of the switches 42a and 42b may also be different.

Second Embodiment

Figure 4:
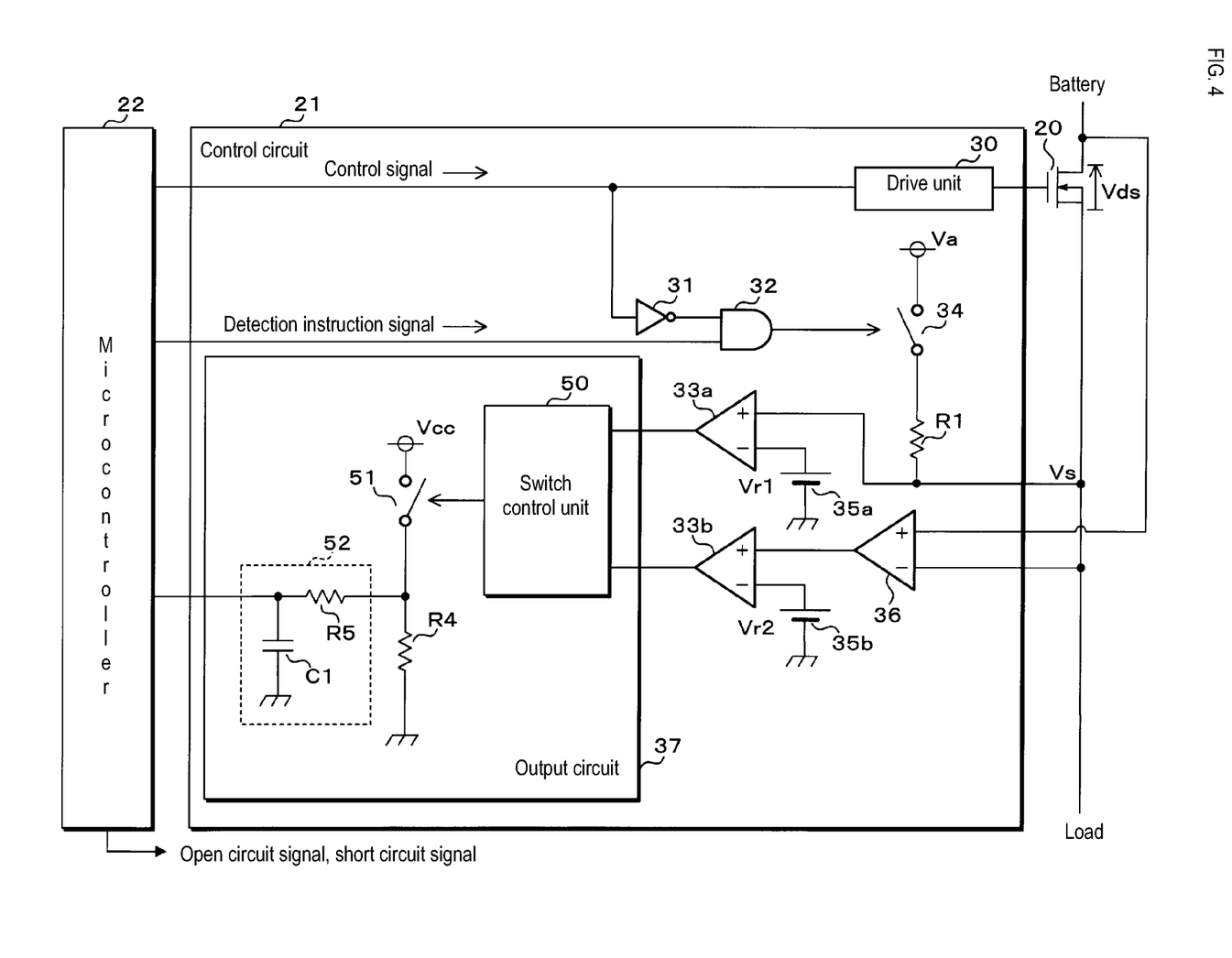
FIG. 4 is a circuit diagram of the control circuit in a second embodiment.

FIG. 4 is a circuit diagram of the control circuit 21 according to a second embodiment. In the power supply system 1 of the second embodiment, the configuration of the output circuit 37 is different to the power supply system 1 in the first embodiment.

The following describes points of the second embodiment that differ from the first embodiment. Other configurations not including configurations that will be mentioned later share common points with the first embodiment, and the constituting members which are the same as in the first embodiment shall have the same reference numeral attached and their descriptions shall be omitted.

The output circuit 37 of the second embodiment has a switch control unit 50, a switch 51, a smoothing circuit 52, and the resistor R4. The smoothing circuit 52 has a capacitor C1 and a resistor R5.

The output ends of the comparators 33a and 33b are connected to the switch control unit 50. A voltage is applied to one end of the switch 51. The voltage value Vcc of this voltage is a positive fixed value. The other end of the switch 51 is connected to one end of the resistor R4. The other end of the resistor R4 is grounded. Accordingly, a fixed voltage is applied between one end of the switch 51 and the other end of the resistor R4. The switch 51 and the resistor R4 function as a second switch and a second resistor respectively.

A connection node between the switch 51 and the resistor R4 is connected to the resistor R5 of the smoothing circuit 52. The other end of the resistor R5 is connected to the microcontroller 22 and to one end of the capacitor C1 of the smoothing circuit 52. The other end of the capacitor C1 is grounded.

The switch control unit 50 alternately switches the switch ON and OFF. Specifically, the switch control unit 50 switches the switch 51 from OFF to ON in a predetermined cycle, or switches the switch 51 from ON to OFF in a predetermined cycle. The switch control unit 50 adjusts a duty ratio Td, which is a ratio of the ON period when the switch 51 is ON in one cycle. The duty ratio Td is equal to or greater than zero, and is equal to or less than 1. If the duty ratio Td is zero, the switch 51 is kept OFF, and if the duty ratio Td is 1, the switch 51 is kept ON.

While the switch 51 is ON, a voltage of the voltage value Vcc is applied across the two ends of the resistor R4. The smoothing circuit 52 applies the voltage across the two ends of the resistor R4 to both ends of the capacitor C1 via the resistor R5. Through this, the capacitor C1 is charged and the voltage value across the two ends of the capacitor C1 rises.

While the switch 51 is OFF, current flows from one end of the capacitor C1 to the resistors R5 and R4 in that order. Through this, the capacitor C1 discharges and the voltage value across the two ends of the capacitor C1 falls.

The smoothing circuit 52 smooths the voltage across the two ends of the resistor R4 by the operation of the capacitor C1. The smoothed voltage smoothed by the smoothing circuit 52, or more specifically, the voltage across the two ends of the capacitor C1, is output to the microcontroller 22. The smoothing circuit 52 functions as an output unit.

The voltage value Vh of smoothed voltage is dependent on the duty ratio Td, and can be expressed with Vcc·Td (0≤Td≤1). The larger the duty ratio Td is, the higher the voltage value Th becomes. If the duty ratio Td is zero, the voltage value of the smoothed voltage is zero, and if the duty ratio Td is 1, the voltage value Vh of the smoothed voltage matches the voltage value Vcc.

The voltage value output by the comparators 33a and 33b, that is, the result of a comparison performed by the comparators 33a and 33b, is input to the switch control unit 50. As previously described in the first embodiment, if the source voltage value Vs is less than the output voltage value Vr1 of the direct-current power source 35am, and the end-to-end voltage value Vds is greater than or equal to the threshold value Vth2, the comparators 33a and 33b output low-level voltage and high-level voltage respectively. If the source voltage value Vs is greater than or equal to the output voltage value Vr1 of the direct-current power source 35a, and the end-to-end voltage value Vds is greater than or equal to the threshold value Vth2, the comparators 33a and 33b both output high-level voltage. If the source voltage value Vs is greater than or equal to the output voltage value Vr1 of the direct-current power source 35a, and the end-to-end voltage value Vds is less than the threshold value Vth, the comparators 33a and 33b output high-level voltage and low-level voltage respectively.

If, as a result of a comparison performed by the comparators 33a and 33b, the source voltage value Vs is less than the output voltage value Vr1 of the direct-current power source 35a, and the end-to-end voltage value Vds is greater than or equal to the threshold value Vth2, then the switch control unit 50 adjusts the duty ratio Td to zero. Through this, zero V is output from the smoothing circuit 52 of the output circuit 37 to the microcontroller 22.

As in the first embodiment, if zero V is output from the output circuit 37 to the microcontroller 22, a notification is given to the microcontroller 22 that the status of the power supply system 1 is normal.

If, as a result of a comparison performed by comparators 33a and 33b, the source voltage value Vs is greater than or equal to the output voltage value Vr1 of the direct-current power source 35a, and the end-to-end voltage value Vds is greater than or equal to the threshold value Vth2, then the switch control unit 50 adjusts the duty ratio Td to a first duty ratio T1. Through this, the first voltage is output from the smoothing circuit 52 of the output circuit 37 to the microcontroller 22. The voltage value of the first voltage can be expressed by Vc·T1.

As in the first embodiment, if the first voltage is output from the output circuit 37 to the microcontroller 22, the microcontroller 22 is notified that there is an open circuit at the source of the main switch 20, and the microcontroller 22 outputs an open circuit signal to an exterior apparatus.

If, as a result of a comparison performed by the comparators 33a and 33b, the source voltage value Vs is greater than or equal to the output voltage value Vr1 of the direct-current power source 35a, and the end-to-end voltage value Vds is less than the threshold value Vth2, then the switch control unit 50 adjusts the duty ratio Td to the second duty ratio T2. Through this, the second voltage is output from the smoothing circuit 52 of the output circuit 37 to the microcontroller 22. The voltage value of the second voltage can be expressed as Vcc·T2.

As in the first embodiment, if the second voltage value is output from the output circuit 37 to the microcontroller 22, the microcontroller 22 is notified of a short circuit between the drain and the source of the main switch 20, and the microcontroller 22 outputs a short circuit signal to an external apparatus.

The second duty ratio T2 is different from the first duty ratio. For example, if the first duty ratio is 0.6 and the second duty ratio is 1, when the voltage value Vcc is 5V, the first voltage value is 3V and the second voltage value 5V.

The power supply control device 10 of the second embodiment configured as described above causes a beneficial effect that is the same as the beneficial effect caused by the power supply control device 10 in the first embodiment.

Note that, in the second embodiment, the duty ratio Td adjusted by the switch control unit 50, as a result of a comparison performed by the comparators 33a and 33b, if the source voltage value Vs is less than the output voltage value Vr1 of the direct-current power source 35a, and the end-to-end voltage value Vds is greater than or equal to the threshold value Vths is not limited to zero, and the first duty ratio T1 and the second duty ratio T2 should be different from each other.

Also, in the first and second embodiments, the output circuit 37 is not limited to a circuit that outputs a voltage whose voltage value is based on the result of a comparison performed by the comparators 33a and 33b. The output circuit 37 may also be a circuit that outputs, to the microcontroller 22 a status signal that indicates the status of the power supply system 1 based on the result of a comparison performed by the comparators 33a and 33b. The status signal indicates one of either normal status, an open circuit at the source of the main switch 20 or a short circuit between the drain and the source of the main switch 20.

Furthermore, in the first and second embodiments, the main switch 20 is not limited to an N-channel FET, and may also be a P-channel FET, a bipolar transistor or a relay contact.

In the disclosed first and second embodiments, all aspects are exemplary and not to be taken as limitations. The scope of the present disclosure is shown not by the previously described embodiments, but rather by the scope of the claims, and it is intended that all changes within the scope of the claims and their equivalents are included.

The invention claimed is:

1. A power supply control device for controlling the supply of power via a switch, comprising:
a resistor whose one end is connected to a current output end of the switch and to the other end of which a voltage can be applied whose voltage value is lower than an input end voltage value at a current input end of the switch,
a first comparison unit configured to compare an output end voltage value at the current output end with a first threshold value, and
a second comparison unit configured to compare an end-to-end voltage value across the two ends of the switch with a second threshold value,
wherein the first threshold value is lower than an applied voltage value of the voltage applied to the other end of the resistor, and
the second threshold value is lower than a difference between the input end voltage value and the applied voltage value.

2. The power supply control device according to claim 1, further comprising;
an output circuit that, as a result of comparisons performed by the first comparison unit and the second comparison unit, outputs a first voltage if the output end voltage value is greater than or equal to the first threshold value and the end-to-end voltage value is greater than or equal to the second threshold value, and outputs a second voltage whose voltage value is different to the voltage value of the first voltage if the output end voltage value is greater than or equal to the first threshold value and the end-to-end voltage value is less than the second threshold value.

3. The power supply control device according to claim 2 wherein the output circuit comprises;
a second switch,
a second resistor whose one end is connected to one end of the second switch,
an output unit configured to smooth a voltage across the two ends of the second resistor and to output the smoothed voltage, and
a switch control unit that, as a result of a comparison performed by the first comparison unit and the second comparison unit, alternately switches the second switch ON and OFF with a first duty ratio if the output end voltage value is greater than or equal to the first threshold value and the end-to-end voltage value is greater than or equal to the second threshold value, and alternately switches the second switch ON and OFF with a second duty ratio that is different to the first duty ratio if the output end voltage value is greater than or equal to the first threshold value and the end-to-end voltage value is less than the second threshold value,
wherein a fixed voltage is applied to another end of the second switch and the second resistor respectively.

4. The power supply control device according to claim 3, comprising;
an open circuit signal output unit configured to output an open circuit signal indicating an open circuit at the current output end, if the output circuit outputs the first voltage when the switch is in its OFF state.

5. The power supply control device according to claim 3, comprising;
a short circuit signal output unit configured to output a short circuit signal indicating a short circuit between the current input end and the current output end if the output circuit outputs the second voltage when the switch is in its OFF state.

6. The power supply according to claim 3, comprising a third switch connected in series to the resistor.

7. The power supply control device according to claim 2, comprising;
an open circuit signal output unit configured to output an open circuit signal indicating an open circuit at the current output end, if the output circuit outputs the first voltage when the switch is in its OFF state.

8. The power supply according to claim 7, comprising a third switch connected in series to the resistor.

9. The power supply control device according to claim 7, comprising;
a short circuit signal output unit configured to output a short circuit signal indicating a short circuit between the current input end and the current output end if the output circuit outputs the second voltage when the switch is in its OFF state.

10. The power supply according to claim 2, comprising a third switch connected in series to the resistor.

11. The power supply control device according to claim 2, comprising;
a short circuit signal output unit configured to output a short circuit signal indicating a short circuit between the current input end and the current output end if the output circuit outputs the second voltage when the switch is in its OFF state.

12. The power supply according to claim 11, comprising a third switch connected in series to the resistor.

13. The power supply according to claim 1, comprising a third switch connected in series to the resistor.

* * * * *